(12) United States Patent
Zhao

(10) Patent No.: US 10,952,335 B1
(45) Date of Patent: Mar. 16, 2021

(54) FLEXIBLE DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Xiaofeng Zhao, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 16/850,982

(22) Filed: Apr. 16, 2020

(30) Foreign Application Priority Data

Nov. 26, 2019 (CN) .......................... 201911176918.0

(51) Int. Cl.
*H05K 5/00* (2006.01)
*H05K 5/02* (2006.01)

(52) U.S. Cl.
CPC ......... *H05K 5/0017* (2013.01); *H05K 5/0247* (2013.01)

(58) Field of Classification Search
None
See application file for complete search history.

(56) References Cited

U.S. PATENT DOCUMENTS

| 10,073,571 B2* | 9/2018 | Watanabe | G06F 3/0412 |
| 2007/0190881 A1* | 8/2007 | Shibaoka | H04R 7/04 442/228 |
| 2011/0089442 A1* | 4/2011 | Jing | H01L 33/382 257/91 |
| 2015/0153862 A1* | 6/2015 | Nakamura | G06F 3/041 345/173 |
| 2016/0197134 A1* | 7/2016 | Jung | H01L 27/3218 257/40 |
| 2016/0267835 A1* | 9/2016 | Meersman | G06F 3/1446 |
| 2017/0294479 A1* | 10/2017 | Cha | H01L 27/156 |
| 2018/0005999 A1* | 1/2018 | Pang | H01L 25/0753 |
| 2018/0168060 A1* | 6/2018 | Ryu | H05K 5/0017 |

* cited by examiner

*Primary Examiner* — Xanthia C Cunningham

(57) ABSTRACT

The present application discloses a flexible display panel and a display device, including a first edge and a second edge perpendicular to each other, and a first display unit and a second display unit symmetrical to each other. The first display unit is not parallel to the first edge at a preset angle and is connected to the second display unit by signal wires. The signal wires include a first line, a second line, and a third line. The first line is connected to the first display unit and is parallel to the first display unit. The second line is connected to the second display unit and is parallel to the second display unit. Two ends of the third line are respectively connected to the first line and the second line in a zigzag shape. Bending resistance of the flexible display panel of the present application is increased.

18 Claims, 3 Drawing Sheets

FLEXIBLE DISPLAY PANEL AND DISPLAY DEVICE

FIELD OF APPLICATION

The present application is related to the field of display panel technology, and specifically to a flexible display panel and a display device.

BACKGROUND OF APPLICATION

With development of technology, electronic display products show a trend toward the development of thinness and flexibility. However, flexible display panels of the electronic display products are prone to failures during a bending process. Specifically, during the bending process of the flexible display panels, signal wires of the flexible display panels are broken, which causes signals to be interrupted.

Therefore, making a flexible display panel which is resistant to bending is a major and urgent issue in the industry.

SUMMARY OF APPLICATION

The application provides a flexible display panel and a display device to solve a problem of failure of the flexible display panel during a bending process.

In order to solve the above problem, a technical solution adopted by the present application is to provide the flexible display panel. The flexible display panel includes a first edge and a second edge which are perpendicular to each other. The flexible display panel includes a first display unit and a second display unit. The first display unit and the second display unit are symmetrical to each other. The first display unit is not parallel to the first edge at a preset angle. The first display unit and the second display unit are electrically connected by signal wires. The signal wires include a first line, a second line, and a third line. The first line is electrically connected to the first display unit and is parallel to the first display unit. The second line is electrically connected to the second display unit and is parallel to the second display unit. Two ends of the third line are respectively connected to the first line and the second line in a zigzag shape.

In order to solve the above problem, another technical solution adopted by the present application is to provide the display device. The display device includes a housing and the flexible display panel as mentioned above. The flexible display panel is disposed on the housing.

The beneficial effect of the present application is that: the flexible display panel includes the first edge and the second edge which are perpendicular to each other. The flexible display panel includes the first display unit and the second display unit which are electrically connected by the signal wires. The first display unit is not parallel to the first edge at the preset angle. The first display unit and the second display unit are symmetrical to each other. The first display unit and the second display unit can be symmetrical in a direction that the first edge is located. The first display unit and the second display unit can also be symmetrical in a direction that the second edge is located. The signal wires include the first line, the second line, and the third line. The first line is electrically connected to the first display unit and is parallel to the first display unit. The first line is not parallel to the first edge at the preset angle. The second line is electrically connected to the second display unit and is parallel to the second display unit. The two ends of the third line are respectively connected to the first line and the second line in the zigzag shape. As a result, lengths of the signal wires per unit area of the flexible display panel are increased. When the flexible display panel is bent, deformation of the signal wires per unit length becomes smaller, so that the signal wires are less stressed and are not easily to break.

DETAILED DESCRIPTION OF PREFERRED EMBODIMENTS

In order to describe technical solutions in the present application clearly, obviously, described embodiments are merely some but not all of the embodiments of the present application. All other embodiments obtained by a person of ordinary skill in the art based on the embodiments of the present application without creative efforts shall fall within the protection scope of the present application.

Mentioning an "embodiment" in the specification means that a particular characteristic, structure, or feature described with reference to the embodiment may be included in at least one embodiment of the present application. The phrase shown in various locations in the specification may not necessarily refer to a same embodiment, and is not an independent or optional embodiment exclusive from another embodiment. It is explicitly and implicitly understood by persons skilled in the art that the embodiments described in the specification may be combined with another embodiment.

Figure 1:
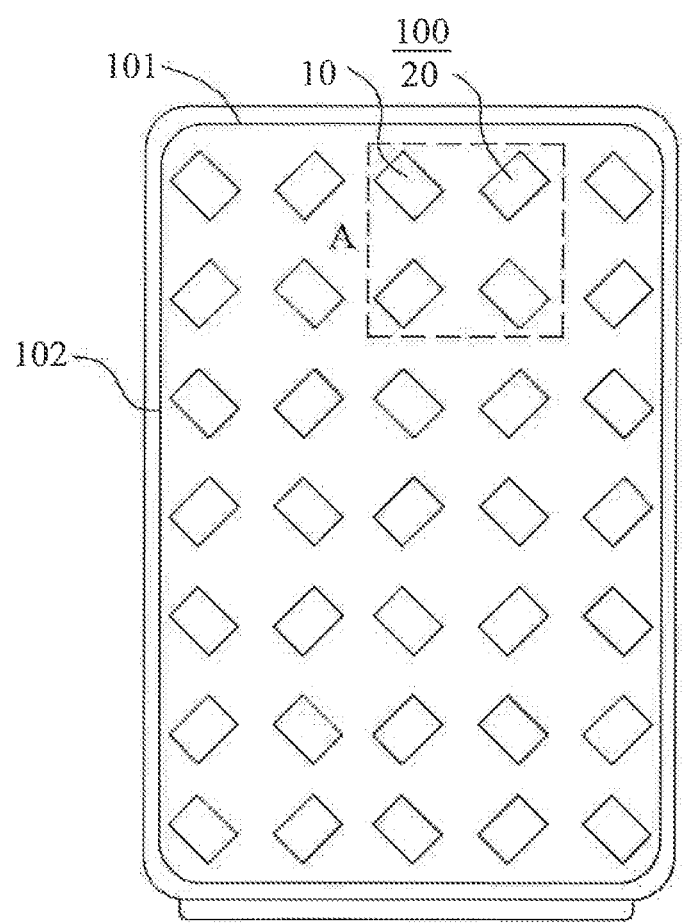
FIG. 1 is a structural diagram of an embodiment of a flexible display panel provided by the present application.
Figure 2:
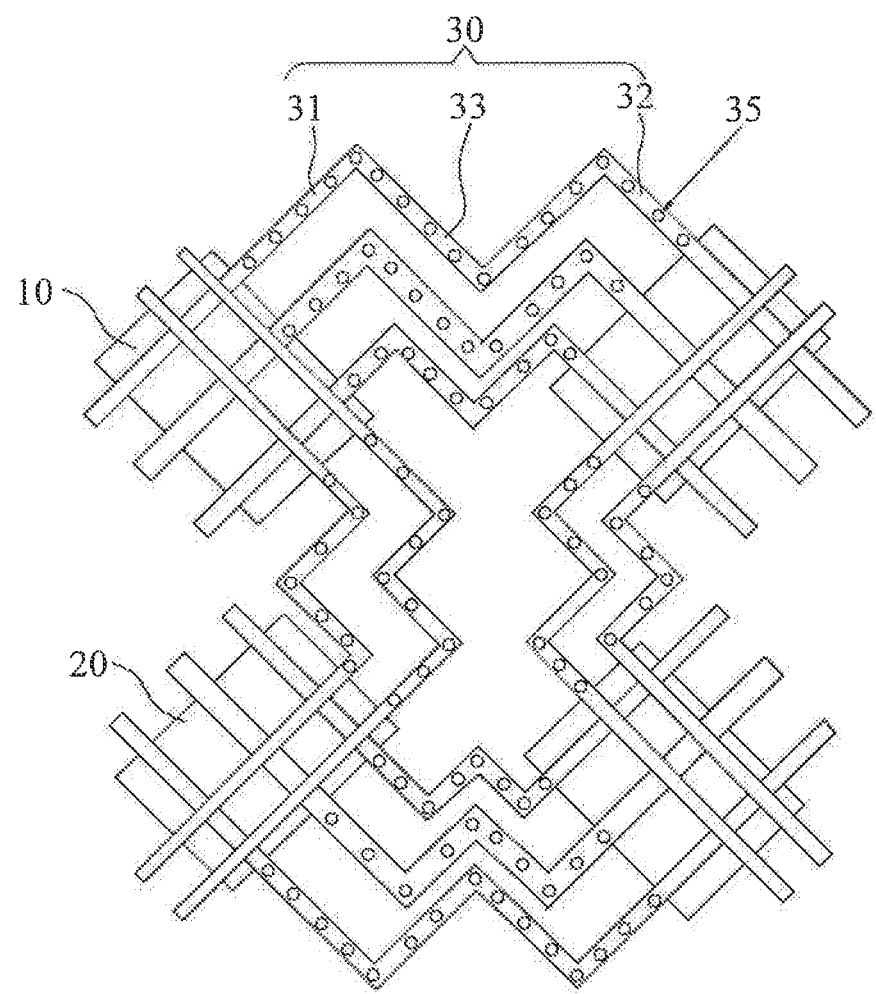
FIG. 2 is a structural diagram of signal wires in a region A in FIG. 1 provided by the present application.

Please refer to FIGS. 1 and 2. FIG. 1 is a structural diagram of an embodiment of a flexible display panel 100 provided by the present application. FIG. 2 is a structural diagram of signal wires 30 in a region A in FIG. 1 provided by the present application.

The flexible display panel 100 of the present application includes a first edge 101 and a second edge 102 which are perpendicular to each other. Understandably, the flexible display panel 100 of the present application can be square or substantially square-shaped. The flexible display panel 100 of the present application can be bent in a direction that the first edge 101 is located. The flexible display panel 100 of the present application can be bent in a direction that the second edge 102 is located.

The flexible display panel 100 includes a first display unit 10 and a second display unit 20, and a number of the first display unit 10 and the second display unit 20 is specifically configured according to a size and a resolution of the flexible display panel 100, which is not limited herein. As shown in FIG. 1, the first display unit 10 can be composed of one pixel, and the first display unit 10 can also be composed of two pixels, three pixels, four pixels, etc., which is not limited herein. The second display unit 20 and the first display unit 10 are composed of a same number of pixels. The first display unit 10 and the second display unit 20 respectively control corresponding light-emitting components to emit light. The first display unit 10 and the second display unit 20 are electrically connected by the signal wires 30. The first display unit 10 is not parallel to the first edge 101 at a preset angle. The first display unit 10 and the second display unit 20 are symmetrical to each other. The first display unit 10 and the second display unit 20 can be symmetrical in the direction that the first edge 101 is located. The first display unit 10 and the second display unit 20 can also be symmetrical in the direction that the second edge 102 is located.

The signal wires 30 include a first line 31, a second line 32, and a third line 33. The first line 31 is electrically connected to the first display unit 10 and is parallel to the first display unit 10. The first line 31 is not parallel to the first edge 101 at the preset angle. The second line 32 is electrically connected to the second display unit 20 and is parallel to the second display unit 20. Two ends of the third line 33 are respectively connected to the first line 31 and the second line 32 in the zigzag shape.

In this embodiment, the flexible display panel 100 includes the first edge 101 and the second edge 102 which are perpendicular to each other. The flexible display panel 100 includes the first display unit 10 and the second display unit 20 which are electrically connected by the signal wires 30. The first display unit 10 is not parallel to the first edge 101 at the preset angle. The first display unit 10 and the second display unit 20 are symmetrical to each other. The first display unit 10 and the second display unit 20 can be symmetrical in the direction that the first edge 101 is located. The first display unit 10 and the second display unit 20 can also be symmetrical in the direction that the second edge 102 is located. The signal wires 30 include the first line 31, the second line 32, and the third line 33. The first line 31 is electrically connected to the first display unit 10 and is parallel to the first display unit 10. The first line 31 is not parallel to the first edge 101 at the preset angle. The second line 32 is electrically connected to the second display unit 20 and is parallel to the second display unit 20. The two ends of the third line 33 are respectively connected to the first line 31 and the second line 32 in the zigzag shape. As a result, lengths of the signal wires 30 per unit area of the flexible display panel 100 are increased. When the flexible display panel 100 is bent, deformation of the signal wires 30 per unit length becomes smaller, so that the signal wires 30 are less stressed and are not easily to break.

Material of the signal wires 30 can be aluminum because aluminum has good ductility. The signal wires 30 can be a power voltage signal line, a circuit ground signal line, a driving signal line, a data signal line, etc.

An angle between the first display unit 10 and the first edge 101 ranges from 20 to 70 degrees. Theoretically, when the angle between the first display unit 10 and the first edge 101 get greater, the lengths of the signal wires 30 per unit area of the flexible display panel 100 are greater, and bendability of the signal wires 30 is better. However, excessively long signal wires 30 will occupy an area of the flexible display panel 100 excessively, thereby reducing pixel density. Therefore, a reasonable arrangement angle between the first display unit 10 and the first edge 101 ranges from 20 to 70 degrees. Without affecting the pixel density of the flexible display panel 100, bending resistance of the flexible display panel 100 is increased.

Optionally, the third line 33 is in a shape of a fold line to further increase a wiring length per unit area of the flexible display panel 100. The third line 33 can be bent once to have a Z shape, and the third line 33 can be bent multiple times to have a wave shape.

A bending angle of the third line 33 can be less than an angle between the third line 33 and the first line 31, so that an arrangement density of the third line 33 is greater than an arrangement density of a junction of the third line 33 and the first line 31. The bending angle of the third line 33 can be less than an angle between the third line 33 and the second line 32, so that the arrangement density of the third line 33 is greater than an arrangement density of a junction of the third line 33 and the second line 32. The bending angle of the third line 33 can be less than an angle between the third line 33 and the first line 31, so that the arrangement density of the third line 33 is greater than the arrangement density of the junction of the third line 33 and the first line 31, and the arrangement density of the third line 33 is greater than the arrangement density of the junction of the third line 33 and the second line 32.

A first rounded corner can be disposed at the junction of the third line 33 and the first line 31, and a second rounded corner can be disposed at the junction of the third line 33 and the second line 32, so that bending resistance of the first line 31, the second line 32, and the third line 33 is increased.

Figure 3:
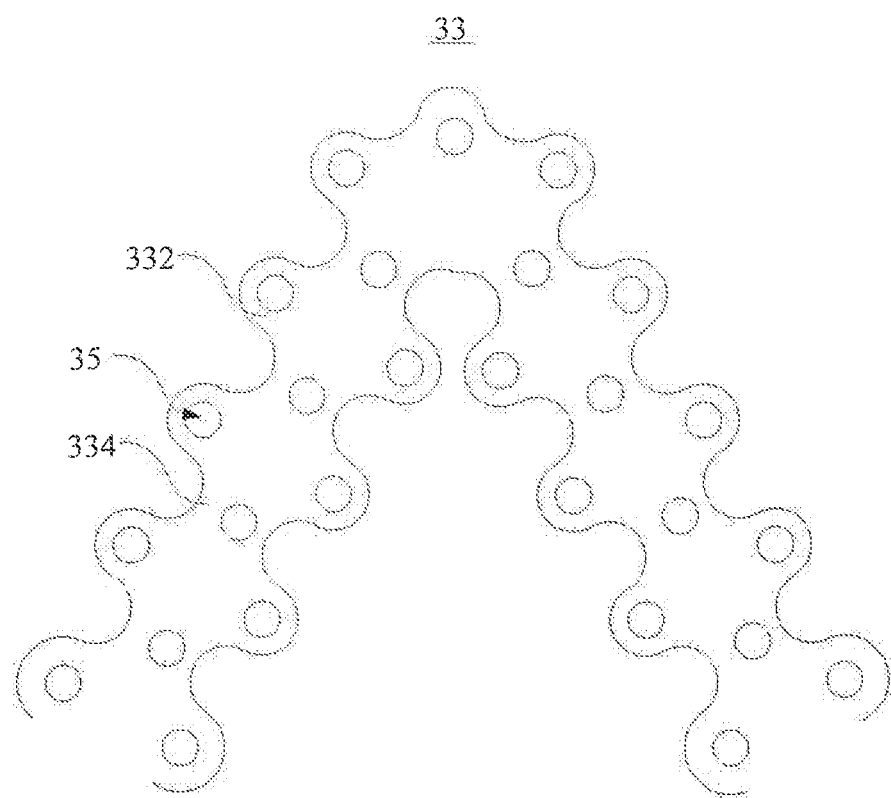
FIG. 3 is a structural diagram of an embodiment of a third line provided by the present application.

Please refer to FIG. 3. FIG. 3 is a structural diagram of an embodiment of the third line 33 provided by the present application.

A plurality of through-holes 35 are disposed on the signal wires 30. The plurality of through-holes 35 are distributed on the first line 31, the second line 32, and the third line 33. The plurality of through-holes 35 effectively offset stress generated by the signal wires 30 during bending, so that bending resistance of the signal wires 30 is increased.

The third line 33 includes big sub-lines 332 and small sub-lines 334 which are alternately connected to each other. A surface area of the big sub-lines 332 is greater than a surface area of the small sub-lines 334, so that a surface area of the signal wires 30 is increased. The big sub-lines 332 and the small sub-lines 334 can be connected in an arc shape.

A number of the plurality of through-holes 35 disposed on the big sub-lines 332 is greater than a number of the plurality of through-holes 35 disposed on the small sub-lines 334.

Figure 4:
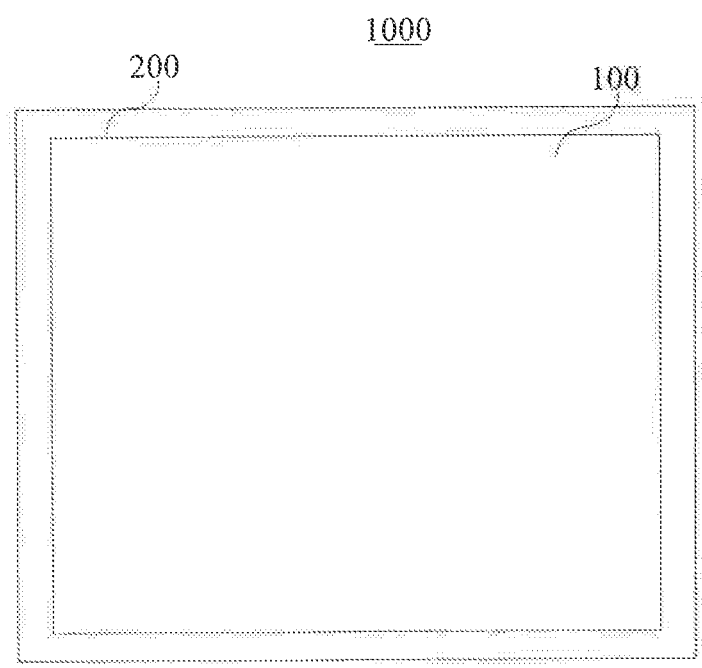
FIG. 4 is a structural diagram of an embodiment of a display device provided by the present application.

Please refer to FIG. 4. FIG. 4 is a structural diagram of an embodiment of a display device 1000 provided by the present application.

The display device 1000 can includes a housing 200 and flexible display panel 100 described in any embodiment of the present application. The flexible display panel 100 is disposed on the housing 200. The display device 1000 can be a mobile phone. The display device 1000 can also be a computer, a television, a smart wearable device, etc.

The above descriptions are merely embodiments of the present application, and are not intended to limit the scope of the present application. An equivalent structural or equivalent process alternation made using the content of the specification and the drawings of the present application, or application of the content of the specification and drawings directly or indirectly to another related technical field, shall fall within the protection scope of the present application.

What is claimed is:

1. A flexible display panel, comprising:
a first edge and a second edge which are perpendicular to each other; and
a first display unit and a second display unit;
wherein the first display unit and the second display unit are symmetrical to each other, the first display unit is not parallel to the first edge at a preset angle, the first display unit and the second display unit are electrically connected by signal wires, the signal wires comprise a first line, a second line, and a third line, the first line is electrically connected to the first display unit and is parallel to the first display unit, the second line is electrically connected to the second display unit and is parallel to the second display unit, and two ends of the third line are respectively connected to the first line and the second line in a zigzag shape.

2. The flexible display panel according to claim 1, wherein an angle between the first display unit and the first edge ranges from 20 to 70 degrees.

3. The flexible display panel according to claim 1, wherein the third line is in a shape of a fold line.

4. The flexible display panel according to claim 3, wherein a bending angle of the third line is less than an angle between the third line and the first line, and/or the bending angle of the third line is less than an angle between the third line and the second line.

5. The flexible display panel according to claim 1, wherein a first rounded corner is disposed at a junction of the third line and the first line, and a second rounded corner is disposed at a junction of the third line and the second line.

6. The flexible display panel according to claim 1, wherein a plurality of through-holes are disposed on the signal wires, and the plurality of through-holes are distributed on the first line, the second line, and the third line.

7. The flexible display panel according to claim 6, wherein the third line comprises big sub-lines and small sub-lines which are alternately connected to each other, and a surface area of the big sub-lines is greater than a surface area of the small sub-lines.

8. The flexible display panel according to claim 7, wherein a number of the plurality of through-holes disposed on the big sub-lines is greater than a number of the plurality of through-holes disposed on the small sub-lines.

9. The flexible display panel according to claim 7, wherein the big sub-lines and the small sub-lines are connected in an arc shape.

10. A display device, comprising a housing and the flexible display panel according to claim 1, wherein the flexible display panel is disposed on the housing.

11. A display device, comprising a housing and the flexible display panel according to claim 2, wherein the flexible display panel is disposed on the housing.

12. A display device, comprising a housing and the flexible display panel according to claim 3, wherein the flexible display panel is disposed on the housing.

13. A display device, comprising a housing and the flexible display panel according to claim 4, wherein the flexible display panel is disposed on the housing.

14. A display device, comprising a housing and the flexible display panel according to claim 5, wherein the flexible display panel is disposed on the housing.

15. A display device, comprising a housing and the flexible display panel according to claim 6, wherein the flexible display panel is disposed on the housing.

16. A display device, comprising a housing and the flexible display panel according to claim 7, wherein the flexible display panel is disposed on the housing.

17. A display device, comprising a housing and the flexible display panel according to claim 8, wherein the flexible display panel is disposed on the housing.

18. A display device, comprising a housing and the flexible display panel according to claim 9, wherein the flexible display panel is disposed on the housing.

* * * * *